United States Patent [19]
Fujisaki

[11] Patent Number: 5,852,618
[45] Date of Patent: Dec. 22, 1998

[54] MULTIPLE BIT TEST PATTERN GENERATOR

[75] Inventor: Kenichi Fujisaki, Gyoda, Japan

[73] Assignee: Advantest Corp., Tokyo, Japan

[21] Appl. No.: 849,663

[22] PCT Filed: Dec. 1, 1996

[86] PCT No.: PCT/JP96/00036

§ 371 Date: Sep. 8, 1997

§ 102(e) Date: Sep. 8, 1997

[87] PCT Pub. No.: WO97/25718

PCT Pub. Date: Jul. 17, 1997

[51] Int. Cl.$^6$ .................................................. G06F 11/00
[52] U.S. Cl. .......................................................... 371/27.1
[58] Field of Search ................................. 371/27.1, 27.2, 371/26, 25.1, 22.6, 22.5, 22.1

[56] References Cited

U.S. PATENT DOCUMENTS 5,488,614   1/1996   Shima ........................ 371/22
5,617,426   4/1997   Koenemann et al. .................... 371/62

FOREIGN PATENT DOCUMENTS 7-244999   9/1995   Japan .

*Primary Examiner*—Vincent P. Canney
*Attorney, Agent, or Firm*—Muramatsu & Associates

[57] ABSTRACT

A test pattern generator for testing a semiconductor memory with a multi-bit data width and high speed is realized with low cost and small size. The pattern generator includes a data operator having a 1/n width of the data width of a device to be tested, a register which is formed of n bits whose data is established by an instruction memory, and n control logic circuits for controlling the passage of data signals based on the output signal of the register. The control logic circuits include AND gates which transmit the output signal from the data operator based on the output signal of the register and OR gates which provide fixed output signals. The pattern generator further includes an exclusive OR gate for inverting the data based on an output of a flag register.

3 Claims, 5 Drawing Sheets

Control Logic

| Bit7170 — 3210 | Bit7170 — 3210 |
|---|---|
| 00 ------ 0001 | 11 ------ 1110 |
| 00 ------ 0010 | 11 ------ 1101 |
| 00 ------ 0100 | 11 ------ 1011 |
| 00 ------ 1000 | 11 ------ 0111 |
| 01 ------ 0000 | 10 ------ 1111 |
| 10 ------ 0000 | 01 ------ 1111 |
| (A) 1Shift | (B) 0Shift |

Multi-bit Data Pattern

FIG. 4

| | Register A | | | | Arithmetic Unit Out 17——0 | Data Signal Bit 71——54——0D 17D | 53——0C 17C | 35——18——0B 17B | 17——0 17A——0A |
|---|---|---|---|---|---|---|---|---|---|
| | 0 | 1 | 2 | 3 | | | | | |
| | 0 | 1 | 0 | 0 | 0...001<br>0...010<br>0...100<br>:<br>1...000 | all 0 | all 0 | all 0 | 0...001<br>0...010<br>0...100<br>:<br>1...000 |
| | 1 | 0 | 0 | 0 | 0...001<br>0...010<br>0...100<br>:<br>1...000 | all 0 | all 0 | 0...001<br>0...010<br>0...100<br>:<br>1...000 | all 0 |
| | 0 | 1 | 0 | 0 | 0...001<br>0...010<br>0...100<br>:<br>1...000 | all 0 | 0...001<br>0...010<br>0...100<br>:<br>1...000 | all 0 | all 0 |
| | 0 | 0 | 1 | 0 | 0...001<br>0...010<br>0...100<br>:<br>1...000 | 0...001<br>0...010<br>0...100<br>:<br>1...000 | all 0 | all 0 | all 0 |
| FLG | | | | | | | 0 | | |
| | 0/1 | 0/1 | 0/1 | 0/1 | Same as Above | 0...001<br>0...010<br>0...100<br>:<br>1...000 | all 0 | all 0 | all 0 |
| FLG | | | | | | | 1 | | |
| | | | | | | Inverted Data Pattern | | | |

Example of Pattern Generation

MULTIPLE BIT TEST PATTERN GENERATOR

This application is a 371 of PCT/JP 76/00031 of Dec. 1, 1996.

1. Technical Field

This invention relates to a test pattern generator for testing semiconductor devices, and more particularly to a test pattern generator for testing multi-bit high speed semiconductor memory devices.

2. Background Art

An example of a conventional semiconductor test system for evaluating the quality of semiconductor devices under test is shown in FIG. 5. In the example of FIG. 5, the device under test is a memory. As shown in the drawing, an address signal is provided from an address generator 2 to the memory device under test, and a data signal is provided from a data generator 3 to the memory device under test. These data signals are arranged corresponding to the pin arrangement or the like of the memory device under test by a data selector 4, and are given to the memory device 5 under test. After writing the data in the memory device 5, in the read step, the read out data is given to a logic comparator 6. At the same time, a data signal generated by the data generator 3 is provided to the logic comparator as expected value data through the data selector 4. Each of the generators described above is controlled by a sequence controller 1. A pattern generator is comprised of these generators and the sequence controller in the foregoing.

FIG. 6 shows an example of structure of the conventional data generator 3. As shown in FIG. 6, various arithmetic operations are performed by a data operator 30 for the data provided to an arithmetic unit 32 from an instruction memory 31. The result of the arithmetic operation is again given to the arithmetic unit 32 through a register 33, and an arithmetic operation such as an add/subtract operation or a shift operation is performed. The output of the arithmetic unit 32 is supplied to an exclusive OR gate 35. The exclusive OR gate 35 is controlled by an output signal of a flag register 34. When the output signal of the flag register shows "1", the data from the arithmetic unit is inverted by the exclusive OR gate. The data signal from the exclusive OR gate 35 is provided to the data selector 4.

As described above, in general, the data signal output from the data generator 3 is comprised of a multi-bit data width, typically 18 bits or 36 bits of data width at present. This is because the bit number of the data generator has been increased in response to the increase in the data width of a memory under test (hereafter referred to as "MUT").

However, if the number of bits of the data generator has to be increased in the same manner such as to 72 bits or 144 bits in response to the data width and also has to meet the increasing speed of MUT, the size and speed of the hardware in the data operator 30 must be increased accordingly. That is, the scale of the hardware for an arithmetic unit, registers and their peripheral circuits will be dramatically increased. In addition, the size of the pattern generator will be too large and the cost will be too high.

In order to realize an arithmetic unit to match the multi-bit and high speed data, it is a common practice to employ a bit slice structure by dividing the data into groups of several bits, and processing the divided data in a pipeline structure having multiple of register stages. However, in such a case, if the data bit width is increased by two times, the corresponding size of the hardware is not simply increased by two times but more than the two times, i.e., further increased by several times more.

In recent years, the data width and operation speed of cache memories used, for example, for a processor in a high speed computer are increasing. It is predicted that the bit width of 36 or 72, and even 144 sill be realized in the near future. For testing such high speed and multi-bit memories, it is necessary to use a high speed test system. If the pattern generator with high speed and multi-bit data is to be formed in the same manner in the conventional technology, it will result in significant increase in the size and the cost of the test system.

Therefore, it is an object of the present invention to solve all of the problems described above and to provide a test pattern generator with low cost and small size for testing a multi-bit high speed semiconductor memory.

DISCLOSURE OF THE INVENTION

In the present invention, in a test pattern generator for testing a memory device 5 with multi-bit data width, a data operator 30 is provided which has a 1/n data width of the data width of the memory under test. A register A141 is provided which is comprised of n bit and is controlled by the control signal from an instruction memory 131. The multi-bit test pattern generator further includes n stages of control logic circuits (151, 152, 153, 154) for controlling the transmission of the output data of the data operator 30 based on the output signal of the register A141.

In the above noted multi-bit test pattern generator, as a specific structure of the control logic circuits (151, 152, 153, 154), AND gates (201, 202, 203) may be provided which serve as passage of the output data of the data operator 30 based on the output signal of the register A141. In this arrangement, the multi-bit test pattern generator may further include OR gates (204, 205, 206) in the control logic circuits for generating a fixed output in response to the output signal of the register A141.

In the multi-bit test pattern generators noted above, an exclusive OR gate 35 is provided between the data operator 30 and the control logic circuits (151, 152, 153, 154). The exclusive OR gate 35 reverses the output data of the data operator 30 in response to a reverse signal from a flag register 34 which is controlled by an instruction signal from the instruction memory 131.

According to the invention, the operational procedure is as follows: First, a flag register 34 is cleared to be zero prior to generating a data pattern. Then, #1 is established in the register A141. Consequently, the 18 bit pattern (D0-17A) from the data operator for which logic "1" is shifted is transmitted at the output of the control logic circuit 151. Then #2 is established in the register A141. Accordingly, the 18 bit pattern (D0-17B) from the data operator for which logic "1" is shifted is generated at the output of the control logic circuit 152. Similarly, by setting #4, #8, respectively, in the register A141, the pattern generated by data operator 30 causes output signals (D0-17C, D0-17D) which are generated at the output of the control logic circuits 153 and 154, respectively. Since "0" bit of the output of the register A141 controls so that the output signals of the corresponding control logic circuits is "0", the shift "1" for the 72 bit pattern can be achieved by generating the 18 bit shift "1" pattern four times by the data operator 30 and sequentially changing the set value of the register A141 from #1, #2, #4 to #8.

BRIEF DESCRIPTION OF THE DRAWINGS

FIG. 3(A) shows an example of the multiple bit pattern of the present invention in which data "1" shifts from bit 0 to 71 in order.

FIG. 3(B) shows an example of the multiple bit pattern of the present invention in which data "0" shifts from bit 0 to 71 in order.

FIG. 4 shows an example of generating the 72 bit shift pattern in the present invention.

BEST MODE FOR CARRYING OUT THE INVENTION

The embodiment of the present invention is explained with reference to the drawings.

Figure 1:
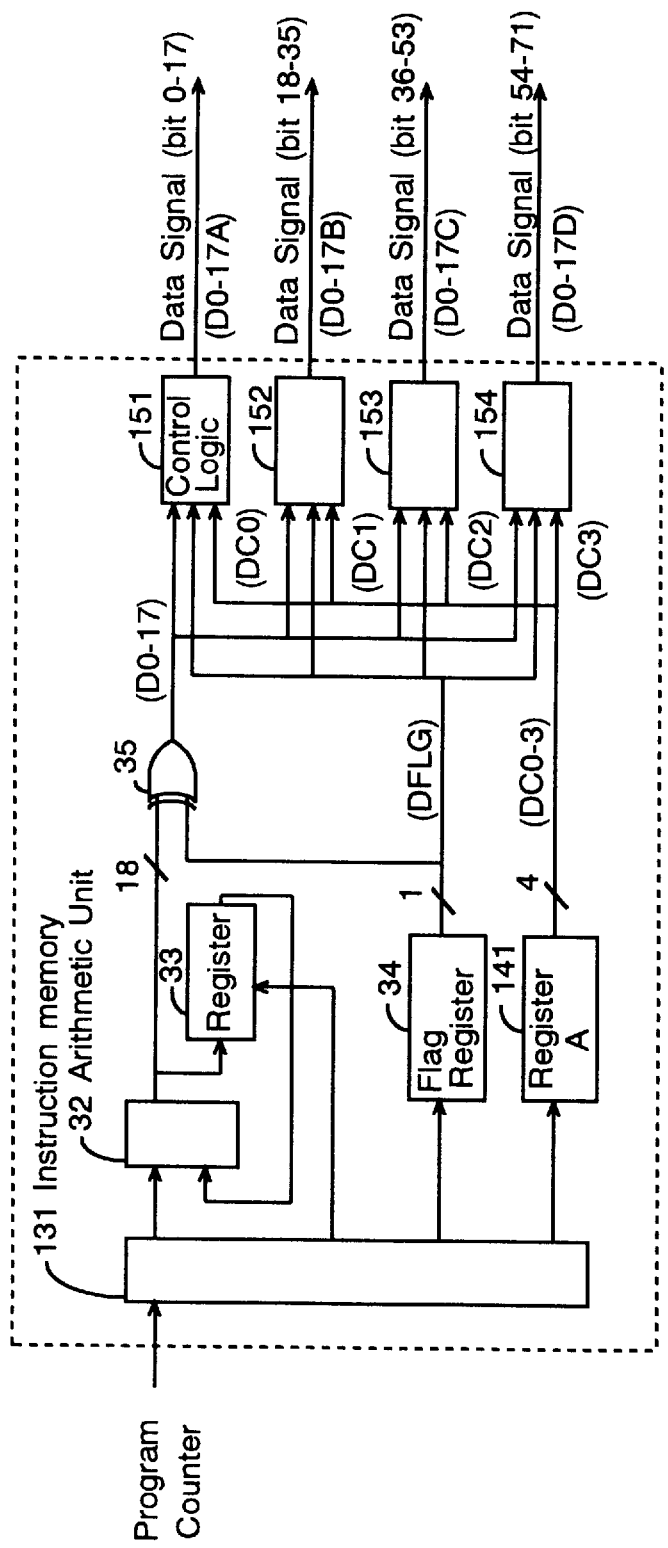
FIG. 1 shows an example of a multiple bit test pattern generator of the present invention corresponding to a 72 bit data width.
Figures 2, 3:
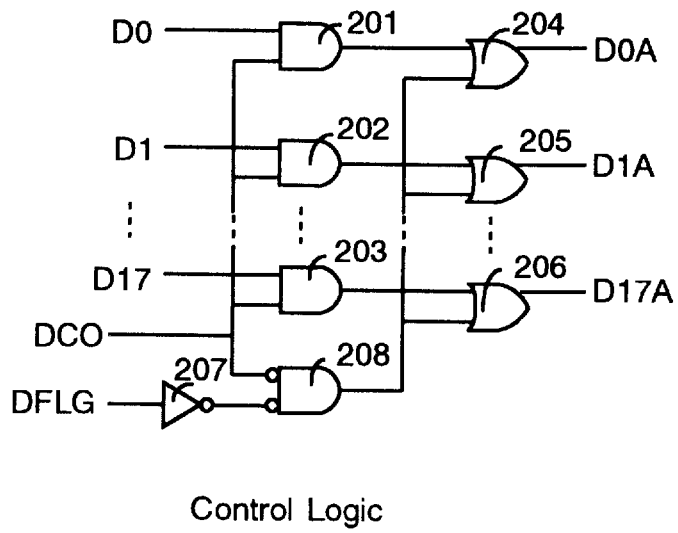
FIG. 2 shows an example of structure of a control logic circuit in the multiple bit test pattern generator of the present invention.
Figure 5:
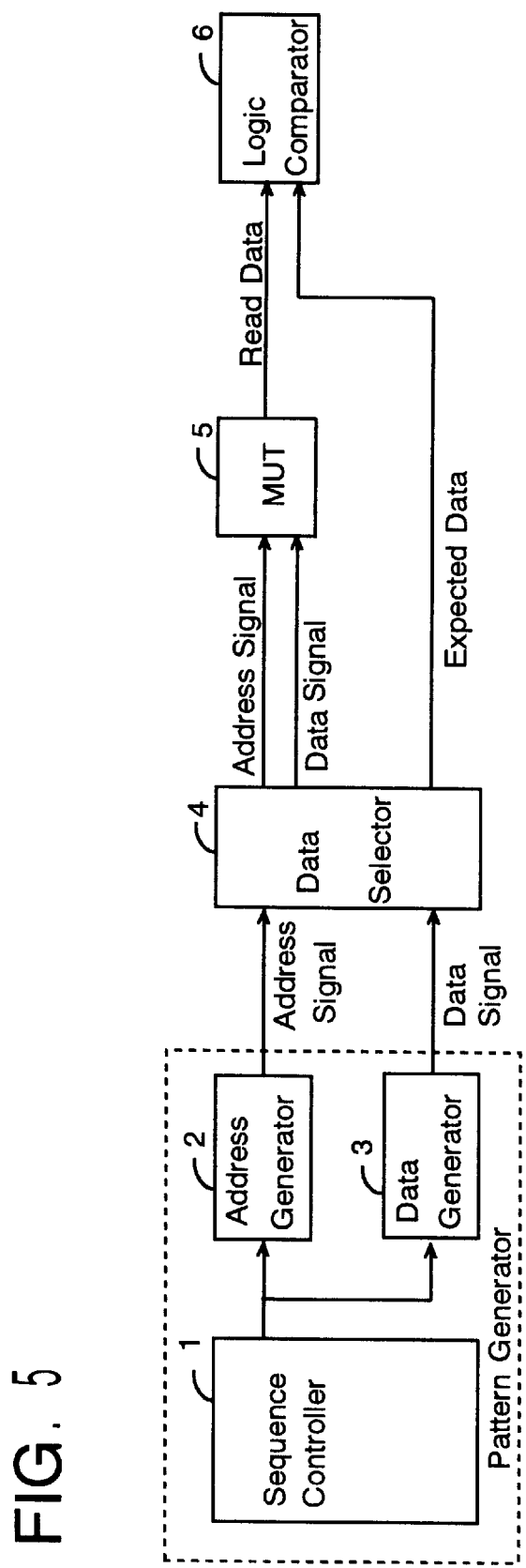
FIG. 5 shows an example of structure of a conventional semiconductor tester which tests the quality of semiconductor devices under test.
Figure 6:
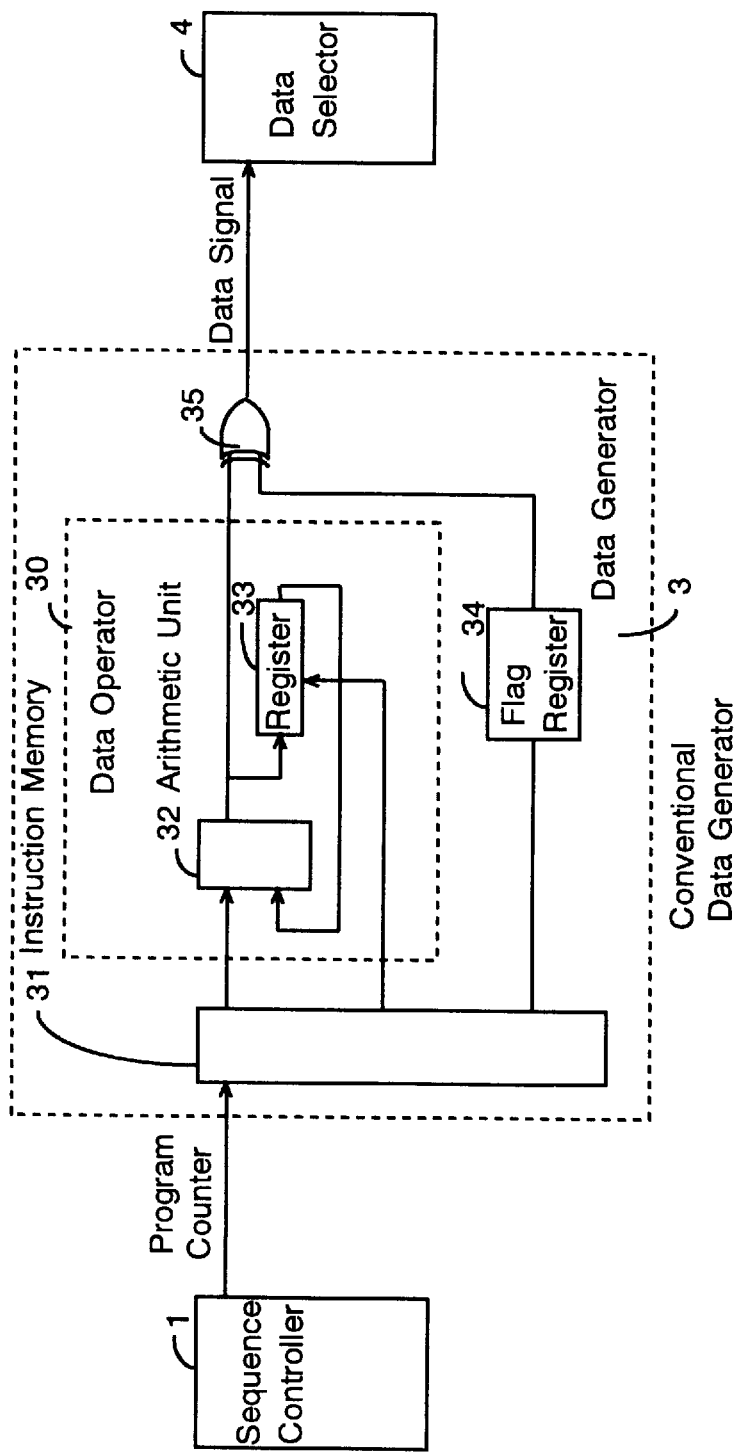
FIG. 6 shows an example of structure of a conventional data generator 3.

FIG. 1 is a block diagram showing an embodiment of multiple bit test pattern generator of the present invention. In the example of FIG. 1, a multiple bit test pattern generator is to generate data having a 72 bit data width. FIG. 2 is a structural example of a control logic circuit in the multiple bit test pattern generator of the present invention.

FIG. 3 shows an example of a multiple bit data pattern. In the example of FIG. 3, the data pattern has a 72 bit width. FIG. 3(A) is a pattern example in which data "1" shifts from bit 0 to bit 71 in order. FIG. 3(B) shows a pattern example in which data "0" shifts from bit 0 to bit 71 in order. As in these examples, it is necessary to be able to distinguish the separation of the generation of a test pattern, i.e., each adjacent bit has to be independent from the other.

As shown in FIG. 1, an arithmetic unit 32 and a register 33 generate 18-bit width data patterns based on a control signal from an instruction memory 131 as in the conventional example. A flag register 34 of a single bit generates a reverse signal (DFLG) by the control signal from the instruction memory 131 as in the conventional example. An exclusive OR gate 35 outputs the above 18 bit width data pattern by reversing the data when the reverse signal (DFLG) value is "1" as in the conventional example.

The output of the exclusive OR gate 35 is connected to a control logic part which is formed of a plurality of control logic circuits (151, 152, 153, 154). When the 18 bit width is expanded to the 72 bit width like the example here, four (4) control logic circuits (72/18=4) are provided. The output of the exclusive OR gate 35 is connected to each of the control logic circuits (151, 152, 153, 154).

A register 141 is a 4-bit register whose data is established by the control signal from the instruction memory 131. Each bit of the output (DC0-3) of the register 141 controls the corresponding control logic circuit (151, 152, 153, 154). As shown in FIG. 1, a signal DC0 controls the control logic circuit 151 and thereby generating a signal (D0-D17A) which corresponds to the output bits (0–17). Similarly, a signal DC1 controls the control logic circuit 152 and thereby generating a signal (D0-D17B) which corresponds to the output bits (18–35). Similarly, a signal DC2 controls the control logic circuit 153 and thereby generating a signal (D0-D17C) which corresponds to the output bits (36–53). Similarly, a signal DC3 controls the control logic circuit 154 and thereby generating a signal (D0-D17D) which corresponds to the output bits (54–71).

FIG. 2 shows an internal structural example of the control logic circuit (151, 152, 153, 154). When the control signal DC0 is "1", an input signal (D0-D17) to the control logic circuit is output as an output signal (D0A-D17A) without any change. When the control signal DC0 is "0", then all of the output signal (D0A-D17A) is transmitted depending on the state of the reverse control signal (DFLG). For example, when the reverse control signal DFLG is "0", all the bits of the output signal (D0A-D17A) are set to "0". When the reverse control signal DFLG is "1", all the bits of the output signal (D0A-D17A) are set to "1".

In the above description, the inverse operation of the data is performed in the front stage of the control logic circuit (151, 152, 153, 154). However, the inverse operation can be performed by the later stage of the control logic circuit (151, 152, 153, 154) as well.

The operation procedure of the present invention is as follows: Before the generation of the data signal, the flag register 34 is cleared to be zero. All the bits (DC0-3) of the register 141 is set to "1". Thus, the output signal (D0-17) from the exclusive OR gate is generated without change at the output of the control logic circuit 151 as an output signal (D0A-17A). Since the state of all the bits (DC0-3) of the register 141 is "1", the output signal (D0-17) of the exclusive OR gate is generated without change at the output of each control logic circuit (152, 153, 154) as output signals (D0-17B, D0-17C, D0-17D), respectively.

FIG. 4 shows an example of generating a 72 bit shift pattern in the present invention. As shown in FIG. 4, the 18 bit data (D0-17) for which logic "1" is shifted in sequence is generated by four times by a data operator 30 having the arithmetic unit 32 and the register 33. In addition, the data from the register 141 is changed as #1, #2, #4, #8 in sequence. As a result, the 72-bit pattern in which logic "1" is consecutively shifted in a manner shown in FIG. 3(A) can be generated.

Similarly, the output of the flag register 34 is set to "1" and the 18 bit data (D0-17) for which logic "0" is shifted in sequence is generated by four times by the data operation area 30. In addition, the data from the register 141 is changed as #1, #2, #4, #8 in sequence. As a result, the 72-bit pattern in which logic "0" is consecutively shifted in a manner shown in FIG. 3(A) can be generated.

Generally, the test pattern for testing MUTs is not limited to the shift patterns shown in FIG. 3. In such a case, the pattern generation is performed by addition and/or subtraction operations and a logic operation to the 18 bit data in the conventional manner. The resulted 18 bit data is developed to 18 bit by 4 block data, thereby obtaining a 72 bit data signal.

As in the foregoing, according to the present invention, the increase in the scale of data generation hardware for generating the data pattern for testing MUT having a 72 bit width can be avoided. Also, as shown in FIG. 2, since the structure of the control logic circuits (151, 152, 153. 154) can be formed of basic logic components such as AND gates (201, 202, 203), OR gates (204, 205, 206) and an inverter (207), a high-speed operation can be achieved. Consequently, the present invention can be easily applied to an MUT having 144 bits by expanding the control logic circuit to 8 blocks and also expanding the bit width of a register A to 8 bits. Thus, the effect of the present invention in suppressing the increase in the size of the data operator is significant.

Industrial Applicability

Since it is configured as described in the foregoing, the present invention has the following effects.

The test pattern generator for testing a semiconductor memory with high-speed and a multiple-bit data width is realized with small size and low cost.

What is claimed is:

1. A multiple bit test pattern generator for evaluating a semiconductor device (5) under test having a multiple data bit width, characterized in having:

a data operator (30) having a 1/n width of said data bit width of said device (5) to be tested;

a register A(141) having n bits whose data is established by a control signal from an instruction memory (131); and n control logic circuits (151, 152, 153, 154) for controlling the passage of the output data of the data operator (30) based on an output signal of said register A(141).

2. A multiple bit test pattern generator as defined in claim 1 characterized that said control logic circuits (151, 152, 153, 154) having:

AND gates (201, 202, 203) which transmit said output data of said data operator (30) in response to said output signal of the said register A(141); and OR gates (204, 205, 206) which transmits a fixed output signal in response to said output signal of the said register A(141).

3. A multiple bit test pattern generator characterized in that:

an exclusive OR gate (35) which reverses the output data of said data operator (30) in response to a reverse signal from a flag register (34) which is controlled by an instruction signal from the instruction memory (131) is provided between said data operator (30) and said control logic area (151, 152, 153, 154).

* * * * *